United States Patent
Kim et al.

(10) Patent No.: US 10,068,957 B2
(45) Date of Patent: Sep. 4, 2018

(54) DISPLAY APPARATUS

(71) Applicant: SAMSUNG DISPLAY CO., LTD., Yongin-si, Gyeonggi-Do (KR)

(72) Inventors: Youngdae Kim, Yongin-si (KR); Taewook Kang, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/440,134

(22) Filed: Feb. 23, 2017

(65) Prior Publication Data
US 2017/0271429 A1 Sep. 21, 2017

(30) Foreign Application Priority Data

Mar. 18, 2016 (KR) .................. 10-2016-0032924

(51) Int. Cl.
H01L 27/00 (2006.01)
H01L 27/32 (2006.01)
H01L 27/146 (2006.01)
H01L 51/52 (2006.01)

(52) U.S. Cl.
CPC .... *H01L 27/3272* (2013.01); *H01L 27/14601* (2013.01); *H01L 27/14603* (2013.01); *H01L 27/14647* (2013.01); *H01L 27/322* (2013.01); *H01L 27/323* (2013.01); *H01L 27/3211* (2013.01); *H01L 27/3244* (2013.01); *H01L 51/5203* (2013.01); *H01L 51/5253* (2013.01)

(58) Field of Classification Search
CPC ......... H01L 27/14603; H01L 27/14601; H01L 27/14647; H01L 27/3244; H01L 27/322
See application file for complete search history.

(56) References Cited

U.S. PATENT DOCUMENTS

| | | | |
|---|---|---|---|
| 9,046,952 B2 | 6/2015 | Kim et al. | |
| 9,304,349 B2 | 4/2016 | Wang | |
| 2003/0058376 A1* | 3/2003 | Zhang | G02F 1/13454 349/43 |
| 2011/0147746 A1* | 6/2011 | Kim | G06F 3/0412 257/59 |
| 2012/0032912 A1* | 2/2012 | Kim | G06F 3/0421 345/174 |

(Continued)

FOREIGN PATENT DOCUMENTS

| | | |
|---|---|---|
| KR | 10-2009-0021709 | 3/2009 |
| KR | 10-2013-0072635 | 7/2013 |

(Continued)

*Primary Examiner* — Ngan Ngo
(74) *Attorney, Agent, or Firm* — F. Chau & Associates, LLC

(57) ABSTRACT

A display apparatus includes a substrate, a plurality of pixel electrodes disposed over the substrate, first metal patterns disposed over the plurality of pixel electrodes and between adjacent pixel electrodes, a first insulating layer disposed over the first metal patterns, second metal patterns disposed over the first insulating layer, in which each second metal pattern is electrically connected to one of the first metal patterns through a contact hole in the first insulating layer, and a light-blocking layer covering the second metal patterns and including first openings respectively corresponding to one of the plurality of pixel electrodes, in which each of the first openings exposes a portion of the first insulating layer.

22 Claims, 8 Drawing Sheets

(56) References Cited

U.S. PATENT DOCUMENTS

| | | | |
|---|---|---|---|
| 2013/0048989 A1* | 2/2013 | Han | H01L 31/1136 257/53 |
| 2014/0225084 A1 | 8/2014 | Oh et al. | |
| 2015/0049030 A1 | 2/2015 | Her | |
| 2015/0155525 A1* | 6/2015 | Sato | H01L 51/5271 257/40 |
| 2016/0035795 A1* | 2/2016 | Lim | H01L 27/322 257/40 |
| 2016/0124133 A1* | 5/2016 | Han | G02B 5/3058 349/43 |
| 2016/0211487 A1* | 7/2016 | Choi | H01L 51/5281 |
| 2016/0365390 A1* | 12/2016 | Hsu | H01L 27/3211 |
| 2016/0380037 A1* | 12/2016 | Kajiyama | H01L 27/3262 257/88 |
| 2017/0090245 A1* | 3/2017 | Tsuchiya | G02B 1/14 |
| 2017/0170245 A1* | 6/2017 | Lin | H01L 27/3246 |
| 2017/0236879 A1* | 8/2017 | Kubota | H01L 27/3206 257/40 |

FOREIGN PATENT DOCUMENTS

| | | |
|---|---|---|
| KR | 10-1311235 | 9/2013 |
| KR | 10-2014-0029171 | 3/2014 |
| KR | 10-2014-0102565 | 8/2014 |
| KR | 10-2014-0126123 | 10/2014 |
| KR | 10-2015-0020929 | 2/2015 |
| KR | 10-1512558 | 4/2015 |
| KR | 10-2015-0103659 | 9/2015 |

* cited by examiner

DISPLAY APPARATUS

CROSS-REFERENCE TO RELATED APPLICATION

This application claims priority under 35 U.S.C. § 119 to Korean Patent Application No. 10-2016-0032924, filed on Mar. 18, 2016 in the Korean Intellectual Property Office, the disclosure of which is incorporated by reference herein in its entirety.

TECHNICAL FIELD

The present invention relates to a display apparatus.

DISCUSSION OF RELATED ART

Generally, a display apparatus displays an image. Display apparatuses are used in various environments especially due to an increase in the number of portable devices. In a portable device having a display apparatus, a touch sensor is provided on an upper surface of a display of the display apparatus. A user may manipulate the display apparatus by directly touching its display. A color filter is included in the display of the display apparatus. The color filter helps to give images more clarity.

When the display apparatus includes a color filter and a touch sensor on a display thereof, the display apparatus becomes thicker. Further, a viewing angle of light emitted from a pixel of the display may be limited by a blocking film disposed on an upper portion of the touch sensor.

SUMMARY

An exemplary embodiment of the present invention provides a display apparatus. The display apparatus includes a substrate, a plurality of pixel electrodes disposed over the substrate, first metal patterns disposed over the plurality of pixel electrodes and between adjacent pixel electrodes, a first insulating layer disposed over the first metal patterns, second metal patterns disposed over the first insulating layer, in which each second metal pattern is electrically connected to a corresponding one of the first metal patterns through a contact hole in the first insulating layer, and a light-blocking layer covering the second metal patterns and including first openings respectively corresponding to one of the plurality of pixel electrodes. Each of the first openings exposes a portion of the first insulating layer.

According to an exemplary embodiment of the present invention, the display apparatus may further include a color filter. The color filter may be disposed in each of the first openings.

According to an exemplary embodiment of the present invention, the first insulating layer may further include color filters. The color filters may transmit light of a plurality of frequency bands. Each of the color filters may respectively correspond to one of the pixel electrodes.

According to an exemplary embodiment of the present invention, the first insulating layer may further include second openings. Each of the second openings may respectively correspond to one of the first openings of the light-blocking layer.

According to an exemplary embodiment of the present invention, the first insulating layer may further include a color filter. The color filter may be disposed in each of the second openings.

According to an exemplary embodiment of the present invention, the first insulating layer may include second openings. The second openings may correspond to at least a portion of the respective first openings of the light-blocking layer.

According to an exemplary embodiment of the present invention, the plurality of pixel electrodes may include a first pixel electrode, a second pixel electrode, and a third pixel electrode. One of the second openings of the first insulating layer may correspond to the second pixel electrode. Another of the second openings of the first insulating layer may correspond to the third pixel electrode.

According to an exemplary embodiment of the present invention, the first insulating layer may include a first color filter for transmitting light of a first frequency band, a second color filter for transmitting light of a second frequency band, and a third color filter for transmitting light of a third frequency band. The first color filter may correspond to the first pixel electrode, the second color filter may correspond to the second pixel electrode, and the third color filter may correspond to the third pixel electrode.

According to an exemplary embodiment of the present invention, the second pixel electrode and the third pixel electrode may be respectively disposed in the second openings of the first insulating layer.

According to an exemplary embodiment of the present invention, the second metal patterns may each include an upper surface and a side surface. The light-blocking layer might not cover the side surface of each of the second metal patterns.

According to an exemplary embodiment of the present invention, at least one of the first metal patterns may include an electrode pattern for a touch screen.

According to an exemplary embodiment of the present invention, the display apparatus may further include an opposite electrode. The opposite electrode may be disposed over each of the plurality of pixel electrodes. The display apparatus may further include an encapsulating layer. The encapsulating layer may cover the opposite electrode. The first metal patterns may be disposed over the encapsulating layer.

An exemplary embodiment of the present invention provides a display apparatus. The display apparatus includes a substrate, a plurality of pixel electrodes disposed over the substrate, first metal patterns disposed over the plurality of pixel electrodes and between adjacent pixel electrodes, a first insulating layer disposed over the first metal patterns and including first openings, in which the first openings respectively correspond to one of the plurality of pixel electrodes, second metal patterns disposed over the first insulating layer, in which each second metal patter is electrically connected to a corresponding one of the first metal patterns through a contact hole in the first insulating layer, and a color filter disposed in each of the first openings of the first insulating layer.

According to an exemplary embodiment of the present invention, the first insulating layer may include a light-blocking material.

According to an exemplary embodiment of the present invention, the display apparatus may further include a second insulating layer. The second insulating layer may cover the second metal patterns and include second openings. Each of the second openings may respectively correspond to one of the first openings of the first insulating layer.

According to an exemplary embodiment of the present invention, the second insulating layer may include a light-blocking material.

According to an exemplary embodiment of the present invention, the second insulating layer may include a low reflection metal.

According to an exemplary embodiment of the present invention, a reflectivity of a first conductive material of the first metal patterns may be lower than a reflectivity of a second conductive material of the second metal patterns.

According to an exemplary embodiment of the present invention, at least one of the first metal patterns and at least one of the second metal patterns may include an electrode pattern for a touch screen.

According to an exemplary embodiment of the present invention, the display apparatus may further include an opposite electrode. The opposite electrode may be disposed over each of the plurality of pixel electrodes. The display apparatus may further include an encapsulating layer. The encapsulating layer may cover the opposite electrode. The first metal patterns may be disposed over the encapsulating layer. The opposite electrode may correspond to the plurality of pixel electrodes.

An exemplary embodiment of the present invention provides a display apparatus. The display apparatus includes a substrate, a plurality of pixel electrodes overlapping the substrate, first metal patterns overlapping the plurality of pixel electrodes, a first insulating layer overlapping the first metal patterns and including first openings, second metal patterns overlapping the first insulating layer and respectfully connected to the first metal patterns, and a color filter disposed in each of the first openings of the first insulating layer.

According to an exemplary embodiment of the present invention, the first insulating layer may include a light-blocking material.

BRIEF DESCRIPTION OF THE DRAWINGS

These and/or other features of the present invention will become more apparent by describing in detail exemplary embodiments thereof with reference to the accompanying drawings, in which.

DETAILED DESCRIPTION OF THE EMBODIMENTS

Figure 1:
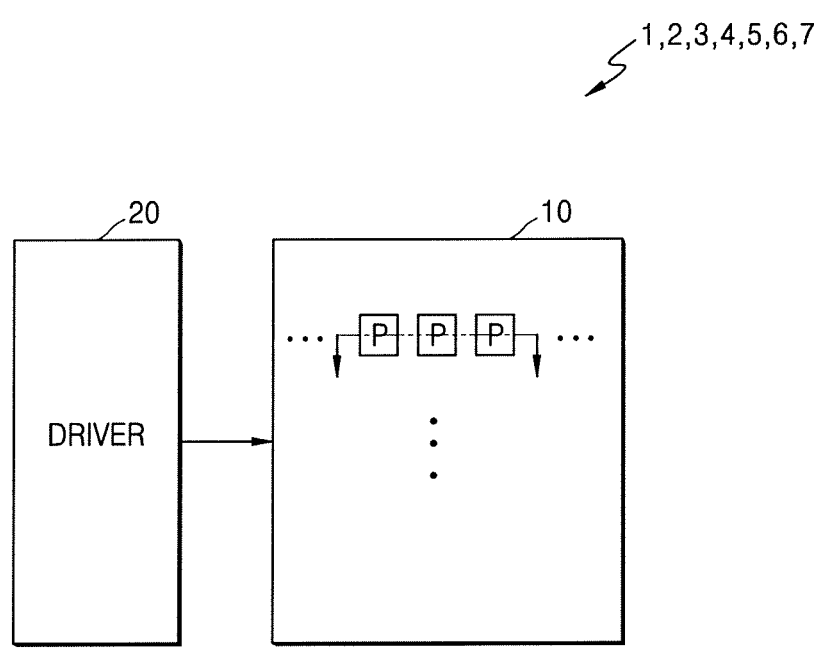
FIG. 1 is a plan view illustrating display apparatuses according to exemplary embodiments of the present invention.

Exemplary embodiments of the present invention will now be described in reference to the drawings. This invention may, however, be embodied in many different forms and should not be construed as limited to the embodiments set forth herein. In the drawings, like reference numerals may refer to like elements.

As used herein, the singular forms "a," "an" and "the" are intended to include the plural forms as well, unless the context clearly indicates otherwise.

Sizes of elements in the drawings may be exaggerated for convenience of explanation.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

It is to be understood that a specific process order may be performed differently from the described order. For example, two consecutively described processes may be performed substantially at the same time or performed in an order opposite to the described order.

FIG. 1 is a plan view illustrating display apparatuses 1, 2, 3, 4, 5, 6, and 7 according to exemplary embodiments of the present invention.

Referring to FIG. 1, the display apparatus 1, 2, 3, 4, 5, 6, and 7 may include a display panel 10 and a driver 20. The display panel 10 may include a plurality of pixels P. The plurality of pixels P may be arranged in a matrix shape over a substrate of the display panel 10. The driver 20 may include a scan driver. The scan driver may respectively apply scan signals to the plurality of pixels P through scan lines. The driver 20 may further include a data driver. The data driver may respectively apply data signals to the plurality of pixels P through corresponding data lines. The driver 20 may be located in a non-display area of the substrate. The non-display area may correspond to a peripheral area of the display panel 10 having the plurality of pixels P arranged therein. The driver 20 may be an integrated chip. The driver 20 may be directly installed on the substrate of the display panel 10. The driver 20 may be installed over a flexible printed circuit film (FPCF). The driver 20 may be attached to the substrate of the display panel 10 as a tape carrier package (TCP) or may be disposed directly on the substrate of the display panel 10.

Figure 2:
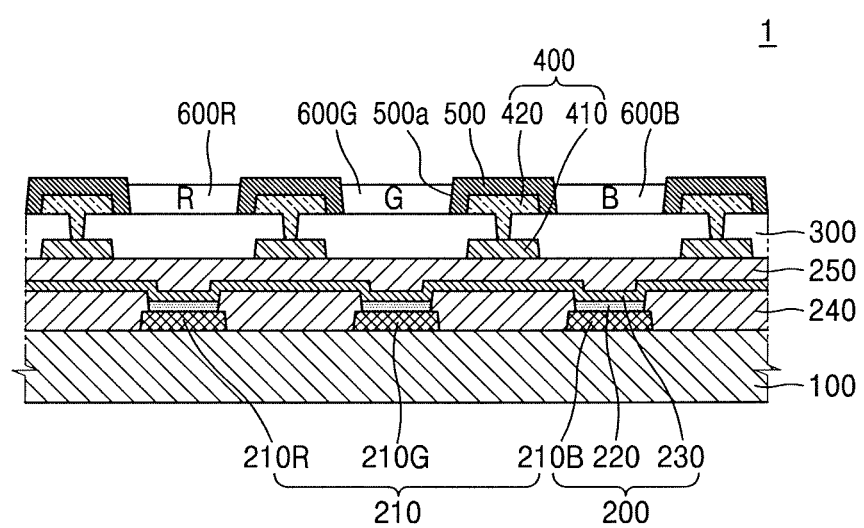
FIG. 2 is a cross-sectional view along a line X-X' of FIG. 1 illustrating a cross-section of a display apparatus according to an exemplary embodiment of the present invention.

FIG. 2 is a cross-sectional view along a line X-X' of FIG. 1 illustrating a cross-section of the display apparatus 1 according to an exemplary embodiment of the present invention.

Referring to FIG. 2, the display apparatus 1 may include a substrate 100, a plurality of pixel electrodes 210 disposed on the substrate 100, first metal patterns 410 arranged over the plurality of pixel electrodes 210, a first insulating layer 300 covering the first metal patterns 410, second metal patterns 420 arranged over the first insulating layer 300, a light-blocking layer 500 covering the second metal patterns 420, and color filters 600 (600R, 600G, 600B).

The substrate 100 may include at least one of various materials, for example, a glass material, a metal material, or a plastic material, such as polyethylene terephthalate (PET), polyethylene naphthalate (PEN), and polyimide (PI). The substrate 100 may include a display area. The display area may include the plurality of pixel electrodes 210. The peripheral area may surround the display area. The substrate 100 may be rigid or flexible. When the substrate 100 is flexible, the substrate 100 may be bendable or foldable.

The plurality of pixel electrodes 210 may be arranged over the substrate 100. For example, the plurality of pixel electrodes 210 may be directly arranged on the substrate 100 or various layers may be formed over the substrate 100 and the plurality of pixel electrodes 210 may be formed over the various layers. For example, a thin film transistor (TFT) may be arranged over the substrate 100, a planarization layer may cover the TFT, and the plurality of pixel electrodes 210 may be disposed over the planarization layer. FIG. 2 illustrates the plurality of pixel electrodes 210 directly on the substrate 100.

The plurality of pixel electrodes 210 may include a semi-transparent electrode or a transparent electrode. Alternatively, the plurality of pixel electrodes 210 may include a reflective electrode. When the plurality of pixel electrodes 210 include a semi-transparent electrode or a transparent electrode, the plurality of pixel electrodes 210 may include indium tin oxide (ITO), indium zinc oxide (IZO), zinc oxide (ZnO), indium oxide ($In_2O_3$), indium gallium oxide (IGO) or aluminum zinc oxide (AZO). When the plurality of pixel electrodes 210 include a reflective electrode, the plurality of pixel electrodes 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a mixture thereof. When the plurality of pixel electrodes 210 include a reflective electrode, the plurality of pixel electrodes 210 may further include a layer including indium tin oxide (ITO), indium zinc oxide (IZO), zinc oxide (ZnO), indium oxide ($In_2O_3$), indium gallium oxide (IGO), or aluminum zinc oxide (AZO). However, the present invention is not limited thereto. The plurality of pixel electrodes 210 may include one or more various materials. The plurality of pixel electrodes 210 may include one or more various structures, for example, a single layer structure or a multilayer structure.

A pixel defining film 240 may be disposed over the plurality of pixel electrodes 210. The pixel defining film 240 may cover a boundary of each of the pixel electrodes 210. The pixel defining film 240 may also expose a center portion of each of the pixel electrodes 210. The pixel defining film 240 may define a pixel area. The pixel defining film 240 may include an organic insulating material, for example, an acrylic-based material or benzocyclobutene (BCB).

The first metal patterns 410 may be disposed over the plurality of pixel electrodes 210. An opposite electrode 230 may be disposed between the plurality of pixel electrodes 210. An encapsulating layer 250 may be disposed between the plurality of pixel electrodes 210 and the first metal patterns 410.

A display portion including the plurality of pixel electrodes 210 may further include a plurality of thin film transistors (TFTs). The plurality of TFTs may be respectively electrically connected to the pixel electrodes 210. The display portion may be a liquid display portion or an organic light-emitting display portion. Hereinafter, a case in which the display portion is an organic light-emitting display portion will be explained as an example.

The opposite electrode 230 may be disposed over the plurality of pixel electrodes 210. The opposite electrode 230 may also correspond to the plurality of pixel electrodes 210. The opposite electrode 230 may be a common electrode disposed over the entire substrate 100 as illustrated in FIG. 2.

The opposite electrode 230 may include a semi-transparent electrode or a transparent electrode. Alternatively, the opposite electrode 230 may include a reflective electrode. When the opposite electrode 230 includes a semi-transparent electrode or a transparent electrode, the opposite electrode 230 may include a layer having a low workability, such as lithium (Li), calcium (Ca), lithium fluoride calcium (LiF/Ca), lithium fluoride aluminum (LiF/Al), aluminum (Al), silver (Ag), magnesium (Mg), or a mixture thereof. When the opposite electrode 230 includes a semi-transparent electrode or a transparent electrode, the opposite electrode 230 may also include a semi-transparent conductive layer or a transparent conductive layer including indium tin oxide (ITO), indium zinc oxide (IZO), zinc oxide (ZnO) or indium oxide ($In_2O_3$). When the opposite electrode 230 includes a reflective electrode, the opposite electrode 230 may include a layer including lithium (Li), calcium (Ca), lithium fluoride calcium (LiF/Ca), lithium fluoride aluminum (LiF/Al), aluminum (Al), silver (Ag), magnesium (Mg), or a mixture thereof. However, a structure and a material of the opposite electrode 230 are not limited thereto and may be variously modified.

A plurality of intermediate layers 220 may be disposed between the plurality of pixel electrodes 210 and the opposite electrode 230. The plurality of intermediate layers 220 may respectively correspond to the plurality of pixel electrodes 210. The plurality of intermediate layers 220 may include an emission layer (EML). The EML may emit light according to an electrical signal. The plurality of intermediate layers 220 may include a single layer or a stacked structure including multiple layers, such as, a hole injection layer (HIL) disposed between the EML and the corresponding pixel electrode 210, a hole transport layer (HTL), an electron transport layer (ETL) disposed between the EML and the opposite electrode 230, and an electron injection layer (EIL). However, the intermediate layer 220 is not limited thereto and may have various structures.

The plurality of pixel electrodes 210 each including the intermediate layer 220 and the opposite electrode 230 may function as an organic light-emitting element 200. The organic light-emitting element 200 may be a pixel or a sub-pixel.

The encapsulating layer 250 may be disposed over the opposite electrode 230. The encapsulating layer 250 may include a multilayer structure in which an organic film and an inorganic film are alternately stacked. The encapsulating layer 250 may prevent permeation of external moisture into the display portion.

A functional layer, such as a polarizer layer, may be disposed over the encapsulating layer 250.

The first metal patterns 410 may be disposed over the plurality of pixel electrodes 210. For example, the intermediate layer 220 and the opposite electrode 230 may be respectively disposed over the plurality of pixel electrodes 210, the encapsulating layer 250 may cover the opposite electrode 230, and the first metal patterns 410 may be disposed over the encapsulating layer 250. The first metal patterns 410 may also be directly disposed on the encapsulating layer 250. According to an exemplary embodiment of the present invention, a planarization layer may be disposed over the encapsulating layer 250 and may flatten an upper surface of the encapsulating layer 250.

The first metal patterns 410 may respectively correspond to portions between adjacent pixel electrodes 210. Since an area in which the plurality of pixel electrodes 210 are disposed is a pixel area to display an image, the first metal patterns 410 may be disposed between the adjacent pixel electrodes 210. The first metal patters 410 may also be disposed in an area in which the plurality of pixel electrodes 210 are not disposed.

The first metal patterns 410 may be a connecting wire 400 for a touch screen. For example, the touch screen may include a plurality of sensors and the first metal patterns 410 may function as the connecting wire 400 to connect the plurality of sensors. Accordingly, the first metal patterns 410 may include a conductive metal material.

The first insulating layer 300 may be disposed over the first metal patterns 410. The first insulating layer 300 may electrically insulate the first metal patterns 410 from the second metal patterns 420. The first insulating layer 300 may include an inorganic insulating material, including silicon oxide, silicon nitride ($Si_3N_4$), or silicon oxynitride ($Si-O_xN_y$). When the first insulating layer 300 includes an organic insulating material, the first insulating layer 300 may include an acrylic-based organic material or BCB.

The second metal patterns 420 may be disposed over the first insulating layer 300. The second metal patterns 420 may be disposed to respectively correspond to the first metal patterns 410. The second metal patterns 420 may be disposed to correspond to each portion between the adjacent pixel electrodes 210, similar to the first metal patterns 410. The first metal patterns 410 and the second metal patterns 420 may be respectively electrically connected to each other through contact holes. The contact holes may be formed in the first insulating layer 300.

The second metal patterns 420 may be the connecting wire 400 for the touch screen, similar to the first metal patterns 410. For example, the touch screen may include a plurality of sensors and the second metal patterns 420 may function as the connecting wire 400 to connect the plurality of sensors. Accordingly, the second metal patterns 420 may include a conductive metal material.

The light-blocking layer 500 may be disposed over the second metal patterns 420. The light-blocking layer 500 may cover the second metal patterns 420. The light-blocking layer 500 may prevent reflection of external light toward the second metal patterns 420. The light-blocking layer 500 may also function as a black matrix to define a light area in which respective pixels simultaneously emit light. The light-blocking layer 500 may include a light-blocking material. The light-blocking layer 500 may include an organic resin, a resin or paste including a glass paste or a black pigment, a metal particle, for example, nickel (Ni), aluminum (Al), molybdenum (Mo), or a compound thereof, a metal oxide particle (e.g., chromium oxide ($Cr_2O_3$)), or a metal nitride particle (e.g., chromium nitride (CrN)).

The light-blocking layer 500 may cover the second metal patterns 420. The light-blocking layer 500 may include first openings 500a. The first openings 500a may each expose at least a portion of the first insulating layer 300 disposed below the light-blocking layer 500. The first openings 500a may respectively correspond to the pixel electrodes 210.

The color filters may include a first color filter 600R, a second color filter 600G, and a third color filter 600B. The color filters 600 may be respectively disposed in the first openings 500a of the light-blocking layer 500. The color filters 600 may respectively correspond to the pixel electrodes 210. The color filters 600 may each transmit light of a corresponding frequency band.

The plurality of pixel electrodes 210 may include a first pixel electrode 210R, a second pixel electrode 210G, and a third pixel electrode 210B. The color filters 600 may include a first color filter 600R to transmit light of a first frequency band, a second color filter 600G to transmit light of a second frequency band, and a third color filter 600B to transmit light of a third frequency band. For example, the first color filter 600R may be a red color filter to transmit red light, the second color filter 600G may be a green color filter to transmit green light, and the third color filter 600B may be a blue color filter to transmit blue light. According to an exemplary embodiment of the present invention, the first color filter 600R may correspond to the first pixel electrode 210R, the second color filter 600G may correspond to the second pixel electrode 210G, and the third color filter 600B may correspond to the third pixel electrode 210B.

Although a display apparatus is generally thin, a total thickness of the display apparatus may increase by separately providing a color filter and a touch screen with the display portion of the display apparatus. Since light-blocking layers may be respectively arranged on the color filter and the touch screen which are disposed over the display portion of the display apparatus, a distance between the organic light-emitting element and the light-blocking layer may increase. Furthermore, since a viewing angle of light emitted from the organic light-emitting element may be narrow, user visibility from a side of the display apparatus may be degraded more than user visibility from a front of the display apparatus.

According to exemplary embodiments of the present invention, the color filter 600 and the touch screen may be formed as a single body. Accordingly, an overall thickness of the display apparatus may be decreased and a manufacturing process may be simplified. Moreover, since the color filter and the light-blocking layer may be formed as a single body, a distance between the organic light-emitting element 200 and the light-blocking layer 500 may decrease. Accordingly, a viewing angle of the light emitted from the organic light-emitting element 200 may widen and the user's visibility may be increased.

Figure 3:
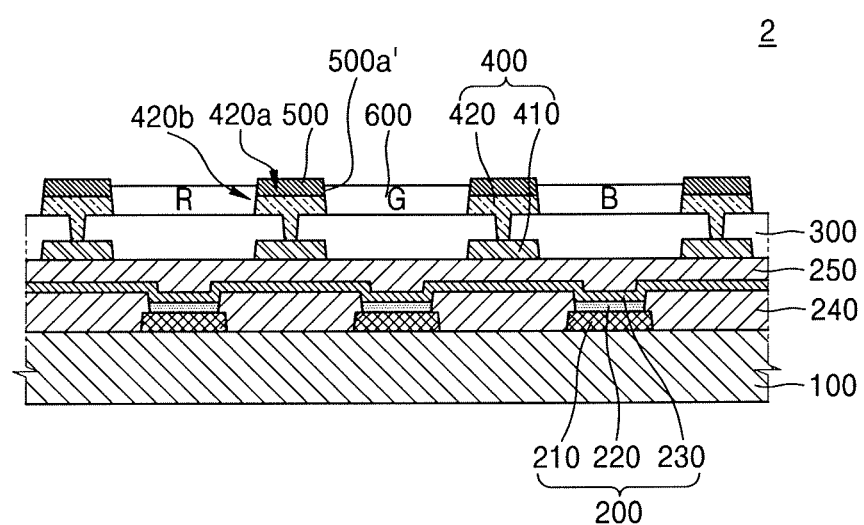
FIG. 3 is a cross-sectional view along a line X-X' of FIG. 1 illustrating a cross-section of a display apparatus according to an exemplary embodiment of the present invention.

FIG. 3 is a cross-sectional view along a line X-X' of FIG. 1 illustrating a cross-section of the display apparatus 2 according to an exemplary embodiment of the present invention.

Referring to FIG. 3, the display apparatus 2 may include a substrate 100, a plurality of pixel electrodes 210 disposed on the substrate 100, first metal patterns 410 arranged over the plurality of pixel electrodes 210, a first insulating layer 300 covering the first metal patterns 410, second metal patterns 420 arranged over the first insulating layer 300, a light-blocking layer 500 covering the second metal patterns 420, and color filters 600.

The display apparatus 2 may include a similar structure as the display apparatus 1 of FIG. 2, except for a structure of the light-blocking layer 500. Accordingly, the structure of the light-blocking layer 500 will be described mostly below and redundant explanations may be omitted.

The light-blocking layer 500 may be disposed over the second metal patterns 420. The light-blocking layer 500 may cover the second metal patterns 420. The light-blocking layer 500 may prevent reflection of external light toward the second metal patterns 420. The light-blocking layer 500 may also function as a black matrix to define a light area in which respective pixels simultaneously emit light. The light-blocking layer 500 may include a light-blocking material. The light-blocking layer 500 may include an organic resin, a resin or paste including a glass paste or a black pigment, a metal particle, for example, nickel (Ni), aluminum (Al), molybdenum (Mo), or a compound thereof, a metal oxide particle (e.g., chromium oxide ($Cr_2O_3$)), or a metal nitride particle (e.g., chromium nitride (CrN)).

The light-blocking layer 500 may cover the second metal patterns 420. According to an exemplary embodiment of the present invention, the second metal patterns 420 may include an upper surface 420a and a side surface 420b. The light-blocking layer 500 may cover the upper surface 420a of the second metal patterns 420. The light-blocking layer 500 may expose the side surfaces 420b of the second metal patterns 420.

The light-blocking layer 500 may cover the second metal patterns 420. The light-blocking layer 500 may include first openings 500a'. The first openings 500a' may each expose at least a portion of the first insulating layer 300 disposed below the light-blocking layer 500. The first openings 500a' may respectively correspond to the pixel electrodes 210. According to an exemplary embodiment of the present invention, the first openings 500a' may expose at least a portion of the first insulating layer 300 and the side surfaces 420b of the second metal patterns 420.

The color filters 600 may be respectively disposed in the first openings 500a' of the light-blocking layer 500. The color filters 600 may respectively correspond to the pixel electrodes 210. The color filters 600 may each transmit light of a corresponding frequency band.

Figure 4:
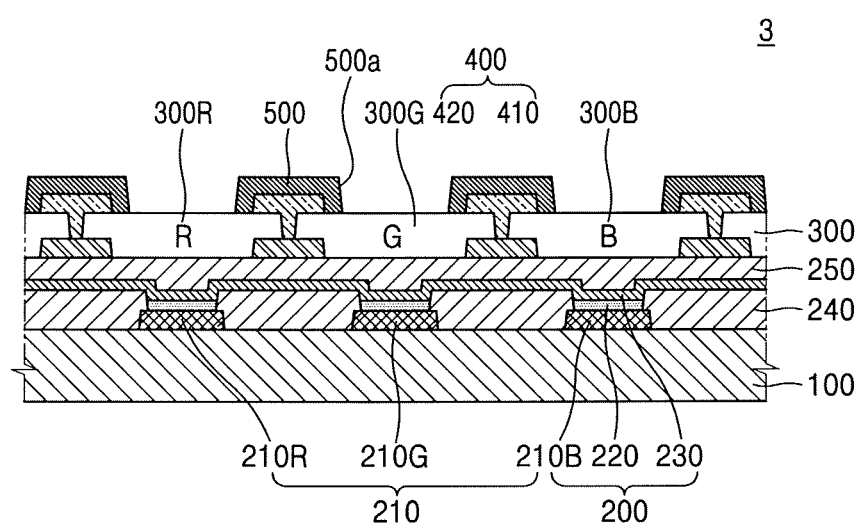
FIG. 4 is a cross-sectional view along a line X-X' of FIG. 1 illustrating a cross-section of a display apparatus according to an exemplary embodiment of the present invention.

FIG. 4 is a cross-sectional view along a line X-X' of FIG. 1 illustrating a cross-section of the display apparatus 3 according to an exemplary embodiment of the present invention.

Referring to FIG. 4, the display apparatus 3 may include a substrate 100, a plurality of pixel electrodes 210 disposed on the substrate 100, first metal patterns 410 arranged over the plurality of pixel electrodes 210, a first insulating layer 300 covering the first metal patterns 410, second metal patterns 420 arranged over the first insulating layer 300, and a light-blocking layer 500 covering the second metal patterns 420, and color filters 300R, 300G, 300B.

The display apparatus 3 may differ from the display apparatus 1 of FIG. 2 in a structure above the encapsulating layer 250. Accordingly, redundant explanations may be omitted.

The first metal patterns 410 may be disposed over the plurality of pixel electrodes 210. For example, the intermediate layer 220 and the opposite electrode 230 may be respectively disposed over the plurality of pixel electrodes 210, the encapsulating layer 250 may cover the opposite electrode 230, and the first metal patterns 410 may be disposed over the encapsulating layer 250. The first metal patterns 410 may also be directly disposed on the encapsulating layer 250. According to an exemplary embodiment of the present invention, a planarization layer may be disposed over the encapsulating layer 250 and may flatten an upper surface of the encapsulating layer 250. The first metal patterns 410 may respectively correspond to portions between the adjacent pixel electrodes 210.

The first insulating layer 300 may be disposed over the first metal patterns 410. The first insulating layer 300 may electrically insulate the first metal patterns 410 from the second metal patterns 420, as described further below.

The first insulating layer 300 may include the color filters 300R, 300G, and 300B. The color filters 300R, 300G, and 300B may respectively transmit light of frequency bands which respectively correspond to the pixel electrodes 210. According to an exemplary embodiment of the present invention, the first insulating layer 300 may be formed as the color filters 300R, 300G, and 300B. For example, the color filters 300R, 300G, and 300B may be formed as the first insulating layer 300. Since the color filters 300R, 300G, and 300B are formed as an insulating film, the color filters 300R, 300G, and 300B are formed as the first insulating layer 300. Therefore, the structure of the display apparatus and the manufacturing process thereof may be simplified.

The second metal patterns 420 may be disposed over the first insulating layer 300. The second metal patterns 420 may be disposed to respectively correspond to the first metal patterns 410. The second metal patterns 420 may be disposed to correspond to each portion between the adjacent pixel electrodes 210, similar to the first metal patterns 410. The first metal patterns 410 and the second metal patterns 420 may be electrically connected to each other through contact holes. The contact holes may be formed in the first insulating layer 300.

According to an exemplary embodiment of the present invention, the second metal patterns 420 may be disposed over the first insulating layer 300. The second metal patterns 420 may be directly disposed on the color filters 300R, 300G, and 300B.

The first metal patterns 410 and the second metal patterns 420 may be the connecting wire 400 for a touch screen. For example, the touch screen may include a plurality of sensors and the first metal patterns 410 and the second metal patterns 420 may function as the connecting wire 400 to connect the plurality of sensors. Accordingly, the first metal patterns 410 and the second metal patterns 420 may include a conductive metal material.

The light-blocking layer 500 may be disposed over the second metal patterns 420. The light-blocking layer 500 may cover the second metal patterns 420. The light-blocking layer 500 may prevent reflection of external light toward the second metal patterns 420. The light-blocking layer 500 may also function as a black matrix to define a light area in which respective pixels simultaneously emit light. The light-blocking layer 500 may include a light-blocking material. The light-blocking layer 500 may include an organic resin, a resin or paste including a glass paste or a black pigment, a metal particle, for example, nickel (Ni), aluminum (Al), molybdenum (Mo), or a compound thereof, a metal oxide particle (e.g., chromium oxide ($Cr_2O_3$)), or a metal nitride particle (e.g., chromium nitride (CrN)).

The light-blocking layer 500 may cover the second metal patterns 420. The light-blocking layer 500 may include first openings 500a. The first openings 500a may each expose at least a portion of the first insulating layer 300 disposed below the light-blocking layer 500. The first openings 500a may respectively correspond to the pixel electrodes 210.

According to an exemplary embodiment of the present invention, the first openings 500a of the light-blocking layer 500 may each expose at least a portion of the first insulating layer 300. The first openings 500a of the light-blocking layer 500 may expose at least corresponding portions of the color filters 300R, 300G, and 300B. For example, the color filters 300R, 300G, and 300B may be disposed to respectively correspond to the plurality of pixel electrodes 210. The first openings 500a may expose at least corresponding portions of the color filters 300R, 300G, and 300B. The color filters 300R, 300G, and 300B may be disposed in the first openings 500a of the light-blocking layer 500 to respectively correspond to the plurality of pixel electrodes 210. The color filters 300R, 300G, and 300B may each transmit substantially all light of a corresponding frequency band.

The plurality of pixel electrodes 210 may include a first pixel electrode 210R, a second pixel electrode 210G, and a third pixel electrode 210B. The color filters 300R, 300G, and 300B may include a first color filter 300R to transmit light of a first frequency band, a second color filter 300G to transmit light of a second frequency band, and a third color filter 300B to transmit light of a third frequency band. For example, the first color filter 300R may be a red color filter to transmit red light, the second color filter 300G may be a green color filter to transmit green light, and the third color filter 300B may be a blue color filter to transmit blue light. According to an exemplary embodiment of the present invention, the first color filter 300R may correspond to the first pixel electrode 210R, the second color filter 300G may correspond to the second pixel electrode 210G and the third color filter 300B may correspond to the third pixel electrode 210B.

Although a display apparatus is generally thin, a total thickness of the display apparatus may increase by separately providing a color filter and a touch screen with the display portion of the display apparatus. Since light-blocking layers may be respectively arranged on the color filter and the touch screen which are disposed over the display portion of the display apparatus, a distance between the organic light-emitting element and the light-blocking layer may increase. Furthermore, since a viewing angle of light emitted from the organic light-emitting element may be narrow, user visibility from a side of the display apparatus may be degraded more than user visibility from the front of the display apparatus.

According to exemplary embodiments of the present invention, the color filter 600 and the touch screen may be formed as a single body. Accordingly, an overall thickness of the display apparatus may be decreased, and a manufacturing process may be simplified. Moreover, since the color filter and the light-blocking layer may be formed as a single body, a distance between the organic light-emitting element 200 and the light-blocking layer 500 may decrease. Accordingly, a viewing angle of the light emitted from the organic light-emitting element 200 may widen and the user's visibility may be increased.

Figure 5:
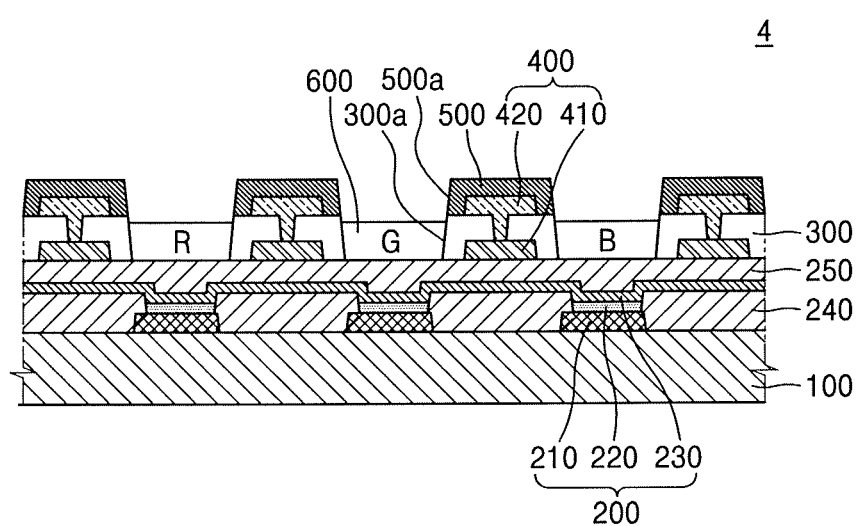
FIG. 5 is a cross-sectional view along a line X-X' of FIG. 1 illustrating a cross-section of a display apparatus according to an exemplary embodiment of the present invention.

FIG. 5 is a cross-sectional view along a line X-X' of FIG. 1 illustrating a cross-section of the display apparatus 4 according to an exemplary embodiment of the present invention.

Referring to FIG. 5, the display apparatus 4 may include a substrate 100, a plurality of pixel electrodes 210 arranged on the substrate 100, first metal patterns 410 arranged over the plurality of pixel electrodes 210, a first insulating layer 300 covering the first metal patterns 410, second metal patterns 420 arranged over the first insulating layer 300, a light-blocking layer 500 covering the second metal patterns 420, and color filters 600.

The display apparatus 4 may differ from the display apparatus 1 of FIG. 2 in a structure above the encapsulating layer 250. Accordingly, redundant explanations may be omitted.

The first metal patterns 410 may be disposed over the plurality of pixel electrodes 210. For example, the intermediate layer 220 and the opposite electrode 230 may be respectively disposed over the plurality of pixel electrodes 210, the encapsulating layer 250 may cover the opposite electrode 230, and the first metal patterns 410 may be disposed over the encapsulating layer 250. The first metal patterns 410 may also be directly disposed on the encapsulating layer 250. According to an exemplary embodiment of the present invention, a planarization layer may be disposed over the encapsulating layer 250 and may flatten an upper surface of the encapsulating layer 250. The first metal patterns 410 may be respectively correspond to portions between the adjacent pixel electrodes 210.

The first insulating layer 300 may be disposed over the first metal patterns 410. The first insulating layer 300 may electrically insulate the first metal patterns 410 from the second metal patterns 420, as described further below. The first insulating layer 300 may include an inorganic insulating material, including silicon oxide, silicon nitride ($Si_3N_4$), or silicon oxynitride ($SiO_xNy$). When the first insulating layer 300 includes an organic insulating material, the first insulating layer 300 may include an acrylic-based organic material or BCB.

The second metal patterns 420 may be disposed over the first insulating layer 300. The second metal patterns 420 may be disposed to respectively correspond to the first metal patterns 410. The second metal patterns 420 may respectively correspond to portions between the adjacent pixel electrodes 210, similar to the first metal patterns 410. The first metal patterns 410 and the second metal patterns 420 may be respectively electrically connected to each other through contact holes. The contact holes may be formed in the first insulating layer 300.

The first metal patterns 410 and the second metal patterns 420 may be the connecting wire 400 for a touch screen. For example, the touch screen may include a plurality of sensors and the first metal patterns 410 and the second metal patterns 420 may function as the connecting wire 400 to connect the plurality of sensors. Accordingly, the first metal patterns 410 and the second metal patterns 420 may include a conductive metal material.

The light-blocking layer 500 may be disposed over the second metal patterns 420. The light-blocking layer 500 may cover the second metal patterns 420. The light-blocking layer 500 may prevent reflection of external light toward the second metal patterns 420. The light-blocking layer 500 may also function as a black matrix to define a light area in which respective pixels simultaneously emit light. The light-blocking layer 500 may include a light-blocking material. The light-blocking layer 500 may include an organic resin, a resin or paste including a glass paste or a black pigment, a metal particle, for example, nickel (Ni), aluminum (Al), molybdenum (Mo), or a compound thereof, a metal oxide particle (e.g., chromium oxide ($Cr_2O_3$)), or a metal nitride particle (e.g., chromium nitride (CrN)).

The light-blocking layer 500 may cover the second metal patterns 420. The light-blocking layer 500 may include first openings 500a. The first openings 500 may respectively correspond to the pixel electrodes 210.

In an exemplary embodiment of the present invention, the first insulating layer 300 may cover the first metal patterns 410. The first insulating layer 300 may include second openings 300a. The second openings 300a may respectively correspond to the plurality of pixel electrodes 210. The first openings 500a of the light-blocking layer 500 may respectively correspond to the second openings 300a of the first insulating layer 300. According to an exemplary embodiment of the present invention, the first openings 500a and the second openings 300a may be simultaneously patterned. According to an exemplary embodiment of the present invention, the second openings 300a of the first insulating layer 300 are patterned and the first openings 500a of the light-blocking layer 500 may be respectively formed over the second openings 300a of the first insulating layer 300. When the first openings 500a and the second openings 300a are simultaneously formed, the first openings 500a and the second openings 300a corresponding to the first openings 500a may have a same internal surface.

As illustrated in FIG. 5, when the first metal patterns 410 are directly disposed on the encapsulating layer 250, the second openings 300a may expose at least a portion of the encapsulating layer 250. In an exemplary embodiment of the present invention, when a separate layer is disposed between the first metal patterns 410 and the encapsulating layer 250, the second openings 300a may expose a portion of the separate layer.

The color filters 600 may be respectively disposed in the second openings 300a. The color filters 600 may transmit substantially all light of frequency bands which correspond to the respective pixel electrodes 210. According to an exemplary embodiment of the present invention, the color filters 600 may be respectively disposed in the second openings 300a. Alternatively, the color filters 600 may be respectively disposed in the first openings 500a depending on a height of the first insulating layer 300.

Although the display apparatus is generally thin, a total thickness of the display apparatus may increase by separately providing a color filter and a touch screen with the display portion of the display apparatus. Since light-blocking layers may be respectively arranged on the color filter and the touch screen which are disposed over the display portion of the display apparatus, a distance between the organic light-emitting element and the light-blocking layer may increase. Furthermore, since a viewing angle of light emitted from the organic light-emitting element may be narrow, user visibility from a side of the display apparatus may be degraded more than user visibility from the front of the display apparatus.

According to exemplary embodiments of the present invention, the color filter 600 and the touch screen may be formed as a single body. Accordingly, an overall thickness of the display apparatus may be decreased and a manufacturing process may be simplified. Moreover, since the color filter and the light-blocking layer may be formed as a single body, a distance between the organic light-emitting element 200 and the light-blocking layer 500 may decrease. Accordingly, a viewing angle of the light emitted from the organic light-emitting element 200 may widen and the user's visibility may be increased.

Figure 6:
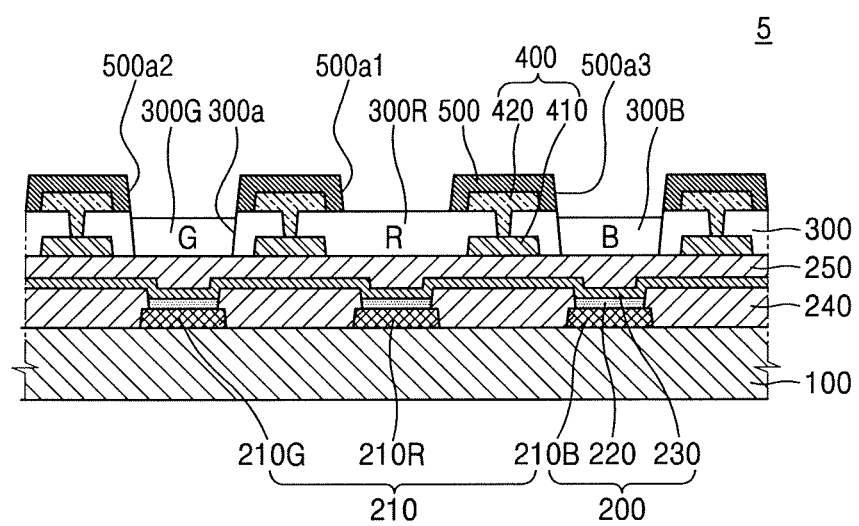
FIG. 6 is a cross-sectional view along a line X-X' of FIG. 1 illustrating a cross-section of a display apparatus according to an exemplary embodiment of the present invention.

FIG. 6 is a cross-sectional view along a line X-X' of FIG. 1 illustrating a cross-section of the display apparatus 5 according to an exemplary embodiment of the present invention.

Referring to FIG. 6, the display apparatus 5 may include a substrate 100, a plurality of pixel electrodes 210 arranged on the substrate 100, first metal patterns 410 arranged over the plurality of pixel electrodes 210, a first insulating layer 300 covering the first metal patterns 410, second metal patterns 420 arranged over the first insulating layer 300, and a light-blocking layer 500 covering the second metal patterns 420, and color filters 300R, 300G, and 300B.

The display apparatus 5 may differ from the display apparatus 1 of FIG. 2 in a structure above the encapsulating layer 250. Accordingly, redundant explanations may be omitted.

The first metal patterns 410 may be disposed over the plurality of pixel electrodes 210. For example, the intermediate layer 220 and the opposite electrode 230 may be respectively disposed over the plurality of pixel electrodes 210, the encapsulating layer 250 may cover the opposite electrode 230, and the first metal patterns 410 may be disposed over the encapsulating layer 250. The first metal patterns 410 may be directly disposed on the encapsulating layer 250. According to an exemplary embodiment of the present invention, a planarization layer may be disposed over the encapsulating layer 250 and may flatten an upper surface of the encapsulating layer 250. The first metal patterns 410 may be disposed to respectively correspond to portions between the adjacent pixel electrodes 210.

The first insulating layer 300 may be disposed over the first metal patterns 410. The first insulating layer 300 may electrically insulate the first metal patterns 410 from the second metal patterns 420, as described further below.

The first insulating layer 300 may include color filters 300R, 300G, and 300B. The color filters 300R, 300G, and 300B may respectively transmit substantially all light of frequency bands which respectively correspond to the pixel electrodes 210. According to an exemplary embodiment of the present invention, the first insulating layer 300 may be one of the color filters 300R, 300G, and 300B. For example, the first insulating layer 300 may be formed as one of the color filters 300R, 300G, and 300B. Since the color filters 300R, 300G, and 300B are formed as an insulating film, the color filters 300R, 300G, and 300B are formed as the first insulating layer 300. Therefore, the structure of the display apparatus and the manufacturing process thereof may be simplified.

According to an exemplary embodiment of the present invention, the first insulating layer 300 may be a first color filter 300R which may transmit light of a first frequency band. FIG. 6 illustrates the first insulating layer 300 may be a red color filter transmitting red light, however, the first insulating layer 300 may be a green color filter transmitting green light or a blue color filter transmitting blue light.

The second metal patterns 420 may be disposed over the first insulating layer 300. The second metal patterns 420 may be disposed to respectively correspond to the first metal patterns 410. The second metal patterns 420 may be disposed to correspond to each portion between the adjacent pixel electrodes 210, similar to the first metal patterns 410. The first metal patterns 410 and the second metal patterns 420 may be respectively electrically connected to each other through contact holes. The contact holes may be formed in the first insulating layer 300.

The first metal patterns 410 and the second metal patterns 420 may be the connecting wire 400 for a touch screen. For example, the touch screen may include a plurality of sensors and the first metal patterns 410 and the second metal patterns 420 may function as the connecting wire 400 to connect the plurality of sensors. Accordingly, the first metal patterns 410 and the second metal patterns 420 may include a conductive metal material.

The light-blocking layer 500 may be disposed over the second metal patterns 420. The light-blocking layer 500 may cover the second metal patterns 420. The light-blocking layer 500 may prevent reflection of external light toward the second metal patterns 420. The light-blocking layer 500 may also function as a black matrix to define a light area in which respective pixels simultaneously emit light. The light-blocking layer 500 may include a light-blocking material. The light-blocking layer 500 may include an organic resin, a resin or paste including a glass paste or a black pigment, a metal particle, for example, nickel (Ni), aluminum (Al), molybdenum (Mo), or a compound thereof, a metal oxide particle (e.g., chromium oxide ($Cr_2O_3$)), or a metal nitride particle (e.g., chromium nitride (CrN)).

The light-blocking layer 500 may cover the second metal patterns 420. The light-blocking layer 500 may include first openings 500a1, 500a2, and 500a3. The first openings 500a1, 500a3, and 500a3 may each expose at least a portion of the first insulating layer 300 disposed below the light-blocking layer 500. The first openings 500a1, 500a2, and 500a3 may respectively correspond to the pixel electrodes 210.

In an exemplary embodiment of the present invention, the first insulating layer 300 may include a first color filter 300R to transmit light of a first frequency band, a second color filter 300G to transmit light of a second frequency band, and a third color filter 300B to transmit light of a third frequency band. For example, the first color filter 300R may be a red color filter to transmit red light, the second color filter 300G may be a green color filter to transmit green light, and the third color filter 300B may be a blue color filter to transmit blue light. According to an exemplary embodiment of the present invention, the first color filter 300R may correspond to the first pixel electrode 210R, the second color filter 300G may correspond to the second pixel electrode 210G, and the third color filter 300B may correspond to the third pixel electrode 210B.

As described above, the plurality of pixel electrodes 210 may include the first pixel electrode 210R, the second pixel electrode 210G, and the third pixel electrode 210B. According to an exemplary embodiment of the present invention, the light-blocking layer 500 may include the first openings 500a, which may include a 1-1 opening 500a1, a 1-2 opening 500a2, and a 1-3 opening 500a3. The 1-1 opening 500a1, the 1-2 opening 500a2, and the 1-3 opening 500a3 may correspond to the first pixel electrode 210R, the second pixel electrode 210G, and the third pixel electrode 210B, respectively. Accordingly, the second openings 300a may respectively correspond to the second pixel electrode 210G and the third pixel electrode 210B.

The first insulating layer 300 may include the second openings 300a which may respectively correspond to portions of the first openings 500a (500a1, 500a2, and 500a3). For example, the light-blocking layer 500 may include the first openings 500a, specifically, the 1-1 opening 500a1, the 1-2 opening 500a2, and the 1-3 opening 500a3. The second openings 300a of the first insulating layer 300 may respectively correspond to the 1-2 opening 500a2 and the 1-3 opening 500a3. As described above, this structure may be referred to as a structure in which the first insulating layer 300 includes the first color filter 300R transmitting light of the first frequency band. For example, since the first insulating layer 300 may be the red color filter transmitting red light, the 1-1 opening 500a1 may expose at least a portion of the first insulating layer 300 so that the red color filter may be exposed.

The portions of the first openings 500a (500a1, 500a2, and 500a3), specifically, the first color filter 300G and the third color filter 300B, may be disposed in the second openings 300a which may correspond to the 1-2 opening 500a2 and the 1-3 opening 500a3, respectively. For example, in an exemplary embodiment of the present invention, the first insulating layer 300 may be the red color filter transmitting red light, the green color filter may be disposed in the second openings 300a which may correspond to the 1-2 openings 500a2, and the blue color filter may be disposed in the second openings 300a which may correspond to the 1-3 openings 500a3.

Although a display apparatus is generally thin, a total thickness of the display apparatus may increase by separately providing a color filter and a touch screen with the display portion of the display apparatus. Since light-blocking layers may be respectively arranged on the color filter and the touch screen which are disposed over the display portion of the display apparatus, a distance between the organic light-emitting element and the light-blocking layer may increase. Furthermore, since a viewing angle of light emitted from the organic light-emitting element may be narrow, user visibility from a side of the related display apparatus may be degraded more than user visibility from a front of the related display apparatus.

According to an exemplary embodiment of the present invention, the color filter 600 and the touch screen may be formed as a single body. Accordingly, an overall thickness of the display apparatus may be decreased, and a manufacturing process may be simplified. Moreover, since the color filter and the light-blocking layer may be formed as a single body, a distance between the organic light-emitting element 200 and the light-blocking layer 500 may decrease. Accordingly, a viewing angle of the light emitted from the organic light-emitting element 200 may widen and the user's visibility may be increased.

Figure 7:
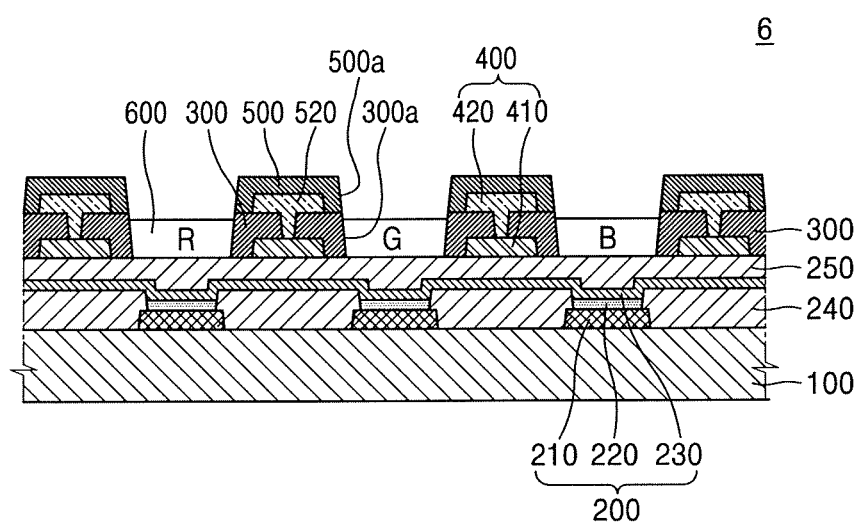
FIG. 7 is a cross-sectional view along a line X-X' of FIG. 1 illustrating a cross-section of a display apparatus according to an exemplary embodiment of the present invention.

FIG. 7 is a cross-sectional view along a line X-X' of FIG. 1 illustrating a cross-section of the display apparatus 6 according to an exemplary embodiment of the present invention.

Referring to FIG. 7, the display apparatus 6 may include a substrate 100, a plurality of pixel electrodes 210 arranged on the substrate 100, first metal patterns 410 arranged over the plurality of pixel electrodes 210, a first insulating layer 300 covering the first metal patterns 410, second metal patterns 420 arranged over the first insulating layer 300, a light-blocking layer 500 covering the second metal patterns 420, and color filters 600.

The display apparatus 6 may differ from the display apparatus 1 of FIG. 2 in a structure above the encapsulating layer 250. Accordingly, redundant explanations may be omitted.

The first metal patterns 410 may be disposed over the plurality of pixel electrodes 210. For example, the intermediate layer 220 and the opposite electrode 230 may be respectively disposed over the plurality of pixel electrodes 210, the encapsulating layer 250 may cover the opposite electrode 230, and the first metal patterns 410 may be disposed over the encapsulating layer 250. The first metal patterns 410 may also be directly disposed on the encapsulating layer 250. According to an exemplary embodiment of the present invention, a planarization layer may be disposed over the encapsulating layer 250 and may flatten an upper surface of the encapsulating layer 250. The first metal patterns 410 may be disposed to respectively correspond to portions between the adjacent pixel electrodes 210.

The first insulating layer 300 may be disposed over the first metal patterns 410. The first insulating layer 300 may electrically insulate the first metal patterns 410 from the second metal patterns 420, as described further below. The first insulating layer 300 may include an insulating material. Accordingly, the first insulating layer 300 may simultaneously function as an insulating film and a black matrix. The first insulating layer 300 may include an organic resin, a resin or paste which includes a glass paste or a black pigment, a metal particle, for example, nickel (Ni), aluminum (Al), molybdenum (Mo), or a compound thereof, a metal oxide particle (for example, chromium oxide ($Cr_2O_3$)), or a metal nitride particle (e.g., chromium nitride (CrN)).

The first insulating layer 300 may cover the first metal patterns 410. The first insulating layer 300 may include second openings 300a respectively corresponding to the plurality of pixel electrodes 210. When the first metal patterns 410 are directly disposed on the encapsulating layer 250, the second openings 300a may expose at least a portion of the encapsulating layer 250. According to an exemplary embodiment of the present invention, when a separate layer is disposed between the first metal patterns 410 and the encapsulating layer 250, the second openings 300a may expose a portion of the separate layer.

The color filters 600 may be disposed in the corresponding first openings 300a of the first insulating layer 300. The color filters 600 may transmit light of frequency bands which respectively correspond to the plurality of pixel electrodes 210.

The second metal patterns 420 may be disposed over the first insulating layer 300. The second metal patterns 420 may be disposed to respectively correspond to the first metal patterns 420. The second metal patterns 420 may be disposed to correspond to each portion between the adjacent pixel electrodes 210, similar to the first metal patterns 410. The first metal patterns 410 and the second metal patterns 420 may be respectively electrically connected to each other through contact holes. The contact holes may be formed in the first insulating layer 300.

The first metal patterns 410 and the second metal patterns 420 may be the connecting wire 400 for a touch screen. For example, the touch screen may include a plurality of sensors and the first metal patterns 410 and the second metal patterns 420 may function as the connecting wire 400 to connect the plurality of sensors. Accordingly, the first metal patterns 410 and the second metal patterns 420 may include a conductive metal material.

Hereinafter, the light-blocking layer 500 may be referred to as a second insulating layer 500 which may be disposed over the second metal patterns 420. The second insulating layer 500 may cover the second metal patterns 420. The second insulating layer 500 may prevent reflection of external light toward the second metal patterns 420. The second insulating layer 500 may also function as a black matrix. The second insulating layer 500 may have first openings 500a corresponding to the respective pixel electrodes 210.

The first openings 500a may correspond to the respective second openings 300a. According to an exemplary embodiment of the present invention, the second openings 300a and the first openings 500a may be simultaneously patterned. According to an exemplary embodiment of the present invention, after the second openings 300a of the first insulating layer 300 are formed, the first openings 500a of the second insulating layer 500 may be formed above the second openings 300a. When the second openings 300a and the first openings 500a are simultaneously formed, the second openings 300a and the first openings 500a corresponding to the second openings 300a may include a same internal surface.

Figure 8:
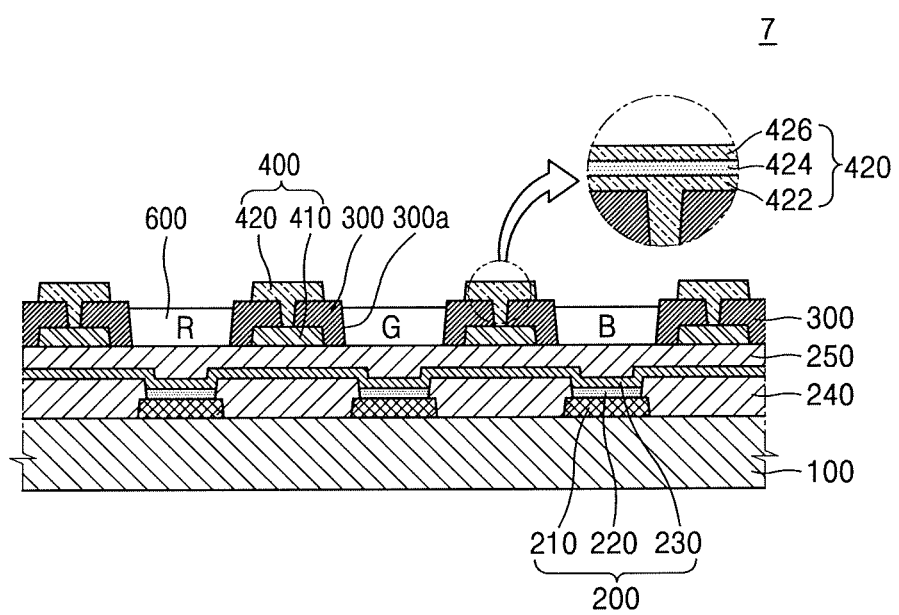
FIG. 8 is a cross-sectional view along a line X-X' of FIG. 1 illustrating a cross-section of a display apparatus according to an exemplary embodiment of the present invention.

FIG. 8 is a cross-sectional view along a line X-X' of FIG. 1 illustrating a cross-section of the display apparatus 7 according to an exemplary embodiment of the present invention.

Referring to FIG. 8, the display apparatus 7 may include a substrate 100, a plurality of pixel electrodes 210 arranged on the substrate 100, first metal patterns 410 arranged over the plurality of pixel electrodes 210, a first insulating layer 300 covering the first metal patterns 410, second metal patterns 420 arranged over the first insulating layer 300, a light-blocking layer 500 covering the second metal patterns 420, and color filters 600.

The display apparatus 7 may differ from the display apparatus 1 of FIG. 2 in a structure above the encapsulating layer 250. Accordingly, redundant explanations may be omitted.

The first metal patterns 410 may be disposed over the plurality of pixel electrodes 210. For example, the intermediate layer 220 and the opposite electrode 230 may be respectively disposed over the plurality of pixel electrodes 210, the encapsulating layer 250 may cover the opposite electrode 230, and the first metal patterns 410 may be disposed over the encapsulating layer 250. The first metal patterns 410 may also be directly disposed on the encapsulating layer 250. According to an exemplary embodiment of the present invention, a planarization layer may be disposed over the encapsulating layer 250 and may flatten an upper surface of the encapsulating layer 250. The first metal patterns 410 may be disposed to respectively correspond to portions between the adjacent pixel electrodes 210.

The first insulating layer 300 may be disposed over the first metal patterns 410. The first insulating layer 300 may electrically insulate the first metal patterns 410 from the second metal patterns 420, as described further below. The first insulating layer 300 may include a light-blocking material. Accordingly, the first insulating layer 300 may simultaneously function as an insulating film and a black matrix. The first insulating layer 300 may include an organic resin, a resin or paste which includes a glass paste or a black pigment, a metal particle, for example, nickel (Ni), aluminum (Al), molybdenum (Mo), or a compound thereof, a metal oxide particle (e.g., chromium oxide ($Cr_2O_3$)), or a metal nitride particle (e.g., chromium nitride (CrN)).

The first insulating layer 300 may cover the first metal patterns 410. The first insulating layer 300 may include second openings 300a respectively corresponding to the plurality of pixel electrodes 210. According to an exemplary embodiment of the present invention, when the first metal patterns 410 are directly disposed on the encapsulating layer 250, the second openings 300a may be disposed to expose at least a portion of the encapsulating layer 250. According to an exemplary embodiment of the present invention, when a separate layer is disposed between the first metal patterns 410 and the encapsulating layer 250, the first openings 300a may expose a portion of the separate layer.

The color filters 600 may be disposed in the corresponding second openings 300a of the first insulating layer 300. The color filters 600 may transmit substantially all light of frequency bands which respectively correspond to the plurality of pixel electrodes 210.

The second metal patterns 420 may be disposed over the first insulating layer 300. The second metal patterns 420 may be disposed to respectively correspond to the first metal patterns 420. The second metal patterns 420 may be disposed to correspond to each portion between the adjacent pixel electrodes 210, similar to the first metal patterns 410. The first metal patterns 410 and the second metal patterns 420 may be respectively electrically connected to each other through contact holes. The contact holes may be formed in the first insulating layer 300.

The first metal patterns 410 and the second metal patterns 420 may be the connecting wire 400 for a touch screen. For example, the touch screen may include a plurality of sensors and the first metal patterns 410 and the second metal patterns 420 may function as the connecting wire 400 to connect the plurality of sensors. Accordingly, the first metal patterns 410 and the second metal patterns 420 may include a conductive metal material.

In an exemplary embodiment of the present invention, the second metal patterns 420 may include a low reflecting metal. For example, the first metal patterns 410 may include a first conductive material and the second metal patterns 420 may include a second conductive material. A reflectivity of the second conductive material of the second metal patterns 420 may be lower than a reflectivity of the first conductive material of the first metal patterns 410.

The second metal patterns 420 may include a three layer film in which a first layer 422, a second layer 424, and a third layer 426, for example, are alternately stacked. In an exemplary embodiment of the present invention, the first layer 422 may include aluminum (Al), the second layer 424 may include aluminum oxide (Al$_2$O$_3$) or indium tin oxide (ITO), and the third layer 426 may include titanium (Ti). The second metal patterns 420 having a multi-structure may include characteristics of low reflectivity of external light by destructive interference of light reflected by each layer. When the second metal patterns 420 are used in the display apparatus, a separate black matrix may not be provided over the second metal patterns 420.

Although a display apparatus is generally thin, a total thickness of the display apparatus may increase by separately providing a color filter and a touch screen with the display portion of the display apparatus. Since light-blocking layers may be respectively arranged on the color filter and the touch screen which are disposed over the display portion of the display apparatus, a distance between the organic light-emitting element and the light-blocking layer may increase. Furthermore, since a viewing angle of light emitted from the organic light-emitting element may be narrow, user visibility from a side of the related display apparatus may be degraded more than a user visibility from a front of the display apparatus.

According to exemplary embodiments of the present invention, the color filter 600 and the touch screen may be formed as a single body. Accordingly, an overall thickness of the display apparatus may be decreased and a manufacturing process may be simplified. Moreover, since the color filter and the light-blocking layer are formed as a single body, a distance between the organic light-emitting element 200 and the light-blocking layer 500 may decrease. Accordingly, a viewing angle of the light emitted from the organic light-emitting element 200 may widen and the user's visibility may be increased.

While the present invention has been particularly shown and in reference to the exemplary embodiments thereof, it will be understood by those of ordinary skill in the art that various changes in form and details may be made therein without departing from the spirit and scope of the inventive concept of as defined by the following claims.

What is claimed is:

1. A display apparatus, comprising:
a substrate;
a plurality of pixel electrodes disposed over the substrate;
first metal patterns disposed over the plurality of pixel electrodes and between adjacent pixel electrodes;
a first insulating layer disposed over the first metal patterns;
second metal patterns disposed over the first insulating layer, wherein each second metal pattern is electrically connected to a corresponding one of the first metal patterns through a contact hole in the first insulating layer; and
a light-blocking layer covering the second metal patterns and comprising first openings respectively corresponding to one of the plurality of pixel electrodes, wherein each of the first openings exposes a portion of the first insulating layer.

2. The display apparatus of claim 1, further comprising:
a color filter disposed in each of the first openings.

3. The display apparatus of claim 1, wherein the first insulating layer further comprises color filters for transmitting light of a plurality of frequency bands, wherein each of the color filters respectively corresponds to one of the pixel electrodes.

4. The display apparatus of claim 1, Wherein the first insulating layer further comprises second openings, wherein each of the second openings respectively corresponds to one of the first openings of the light-blocking layer.

5. The display apparatus of claim 4, wherein the first insulating layer further comprises a color filter disposed in each of the second openings.

6. The display apparatus of claim 1, wherein the first insulating layer comprises second openings to correspond to at least a portion of the respective first openings of the light-blocking layer.

7. The display apparatus of claim 6, wherein:
the plurality of pixel electrodes comprise a first pixel electrode, a second pixel electrode, and a third pixel electrode; and
one of the second openings of the first insulating layer corresponds to the second pixel electrode and another of the second openings of the first insulating layer corresponds to the third pixel electrode.

8. The display apparatus of claim 7, wherein:
the first insulating layer comprises a first color filter for transmitting light of a first frequency band, a second color filter for transmitting light of a second frequency band, and a third color filter for transmitting light of a third frequency band; and
the first color filter corresponds to the first pixel electrode, the second filter corresponds to the second pixel electrode, and the third color filter corresponds to the third pixel electrode.

9. The display apparatus of claim 8, wherein the second pixel electrode and the third pixel electrode are respectively disposed in the second openings of the first insulating layer.

10. The display apparatus of claim 1, wherein:
the second metal patterns each comprise an upper surface and a side surface; and
the light-blocking layer does not cover the side surface of each of the second metal patterns.

11. The display apparatus of claim 1, wherein at least one of the first metal patterns comprises an electrode pattern for a touch screen.

12. The display apparatus of claim 1, further comprising:
an opposite electrode disposed over each of the plurality of pixel electrodes; and
an encapsulating layer covering the opposite electrode, wherein the first metal patterns are disposed over the encapsulating layer.

13. A display apparatus, comprising:
a substrate;
a plurality of pixel electrodes disposed over the substrate;
first metal patterns disposed over the plurality of pixel electrodes and between adjacent pixel electrodes;
a first insulating layer disposed over the first metal patterns and comprising first openings, wherein the first openings respectively correspond to one of the plurality of pixel electrodes;
second metal patterns disposed over the first insulating layer, wherein each second metal pattern is electrically connected to a corresponding one of the first metal patterns through a contact hole in the first insulating layer; and
a color filter disposed in each of the first openings of the first insulating layer.

14. The display apparatus of claim 13, wherein the first insulating layer comprises a light-blocking material.

15. The display apparatus of claim 14, further comprising:
a second insulating layer covering the second metal patterns and comprising second openings, wherein each of the second openings respectively corresponds to one of the first openings of the first insulating layer.

16. The display apparatus of claim 15, wherein the second insulating layer comprises a light-blocking material.

17. The display apparatus of claim 15, wherein the second insulating layer comprises a low reflection metal.

18. The display apparatus of claim 17, wherein a reflectivity of a first conductive material of the first metal patterns is lower than a reflectivity of a second conductive material of the second metal patterns.

19. The display apparatus of claim 13, wherein at least one of the first metal patterns and at least one of the second metal patterns comprises an electrode pattern for a touch screen.

20. The display apparatus of claim 13, further comprising:
an opposite electrode disposed over each of the plurality of pixel electrodes; and
an encapsulating layer covering the opposite electrode,
wherein the first metal patterns are disposed over the encapsulating layer.

21. A display apparatus, comprising:
a substrate;
a plurality of pixel electrodes overlapping the substrate;
first metal patterns overlapping the plurality of pixel electrodes;
a first insulating layer overlapping the first metal patterns and comprising first openings;
second metal patterns overlapping the first insulating layer and respectfully connected to the first metal patterns; and
a color filter disposed in each of the first openings of the first insulating layer.

22. The display apparatus of claim 21, wherein the first insulating layer comprises a light-blocking material.

* * * * *